United States Patent
Lee (10) Patent No.: US 7,027,336 B2
(45) Date of Patent: Apr. 11, 2006

(54) SEMICONDUCTOR MEMORY DEVICE FOR CONTROLLING OUTPUT TIMING OF DATA DEPENDING ON FREQUENCY VARIATION

(75) Inventor: Hyun-Woo Lee, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 0 days.

(21) Appl. No.: 10/876,502

(22) Filed: Jun. 25, 2004

(65) Prior Publication Data

US 2005/0248997 A1   Nov. 10, 2005

(30) Foreign Application Priority Data

May 10, 2004   (KR) .................. 10-2004-0032805

(51) Int. Cl.
*G11C 7/00* (2006.01)
(52) U.S. Cl. ..................... 365/194; 365/236
(58) Field of Classification Search ............ 365/194, 365/236
See application file for complete search history.

(56) References Cited

U.S. PATENT DOCUMENTS

| | | | |
|---|---|---|---|
| 2003/0198097 A1* | 10/2003 | Kono | 365/200 |
| 2004/0008566 A1* | 1/2004 | Song | 365/233 |
| 2005/0108590 A1* | 5/2005 | Janzen | 713/400 |

* cited by examiner

*Primary Examiner*—Michael Tran
(74) *Attorney, Agent, or Firm*—Blakely Sokoloff Taylor & Zafman (57) ABSTRACT

A semiconductor memory device is capable of controlling the data output timing depending on the operating frequency so as to output data with optimized for the operating frequency. Further, in the high frequency operation, the memory device can output data reliably so as to facilitate development of high frequency memory device. The semiconductor memory device comprises a frequency sensing unit for sensing an operating frequency by sensing an amount of lead of a delay locked clock in a delay locked loop compared to an external clock signal, an output enable controlling unit for outputting an output enable signal in response to a CAS latency with controlling the output timing of the output enable signal based on the frequency that is sensed by the frequency sensing unit, and a data output buffer for outputting data that is transferred from a memory core region in response to the output enable signal.

11 Claims, 12 Drawing Sheets

SEMICONDUCTOR MEMORY DEVICE FOR CONTROLLING OUTPUT TIMING OF DATA DEPENDING ON FREQUENCY VARIATION

FIELD OF THE INVENTION

The present invention relates to semiconductor memory devices; and, more particularly, to a synchronous memory device for controlling output timing of data depending on frequency.

BACKGROUND OF THE INVENTION

A semiconductor memory device has been improved for increase of its operating speed as well as its integration. For the purpose of increasing operating speed, a synchronous memory device has been introduced, which can be operated in synchronous to an external clock that is provided from outside of the memory chip.

The first suggested one is, so called, a SDR(single data rate) synchronous memory device that outputs one data within a clock cycle from a data pin in synchronous to the rising edge of the external clock.

However, the SDR synchronous memory device is far from satisfying the system speed that is required for high speed operation. Therefore, another one, so called, a DDR (double data rate) synchronous memory device has been suggested, which process two data within a clock cycle.

In the DDR synchronous memory device, each data input/output pin inputs/outputs consecutive two data in synchronous to the rising edge and the falling edge of the external clock. As a result, without increasing a frequency of a clock, the DDR can implements at least two times of bandwidth compared to the former SDR synchronous memory device so that the high operations can be achieved.

However, because the DDR memory device should input/output two data in a clock cycle, the data access scheme used in the conventional synchronous memory device cannot be used for effectively performing input/output.

If the clock cycle is 10 nsec, two data should be processed consecutively within about 6 nsec substantially, considering rising time and falling time(about 0.5×4=2) and extra time for specification, which is too short to perform this processing in the memory device. Therefore, the memory device input/outputs data at the rising edge and the falling edge only when data should be inputted/outputted to/from an external device, and substantially processes two data at one edge of the clock within the memory device.

Accordingly, a new data access scheme is requested in order to transfer data that is received by the memory device to an inner core or output data from the inner core region to outside.

On the other hand, the synchronous memory device uses a couple of new concepts that are different from the former asynchronous memory device, one of which is CL(CAS Latency).

The CAS latency means the number of clocks between the time when a read command is inputted and the time when the memory device outputs data. For example, CL=3 means that data is outputted outside 3 clock cycles after the read command is inputted to the memory device. Accordingly, a CAS latency mode value determines the timing at which data is outputted, and the memory device senses the set CL during the initial operation to access data to be outputted.

Accordingly, the memory device generates a data output enable signal after delaying a signal that is generated in response to the read command by the number of clock cycles corresponding to the set CL. When the data output enable signal is activated, data that is accessed in response to the read command can be outputted outside.

At this point, the used operating clock is a DLL(delay locked loop) clock that locks an external clock signal after delaying it by a certain time. The DLL clock is generated in a DLL. The memory device should output data exactly in synchronous to the rising edge and the falling edge of the external clock. However, due to the delay time of the clock signal, which happens inevitably during inner processing, data cannot be outputted exactly in synchronous to the rising edge and the falling edge of the external clock.

The DLL clock is generated at the DLL in the memory device in order to compensate such a delay. When data is outputted outside in synchronous to the DLL clock, data can be outputted in synchronous to the rising edge and the falling edge of the external clock.

Figure 1:
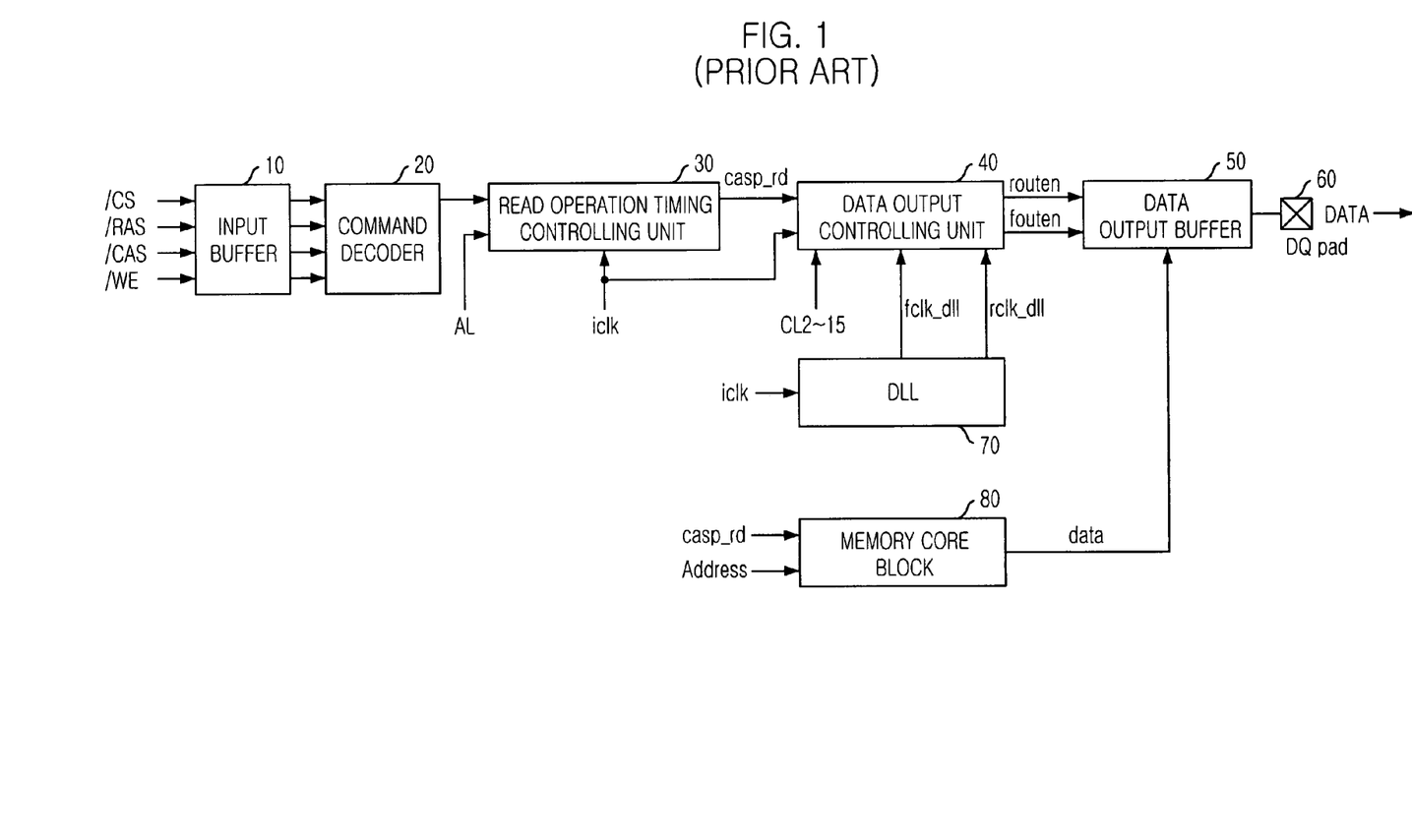
FIG. 1 provides a block diagram of related blocks for outputting data corresponding to a read command in a conventional synchronous memory device.

FIG. 1 provides a block diagram of blocks related to outputting data corresponding to a read command in a conventional synchronous memory device, especially a DDR synchronous memory device.

Referring to FIG. 1, the memory device comprises an input buffer 10 for receiving, buffering and outputting command signals(/CS,/RAS,/CAS,/WE), a command decoder 20 for decoding the command signals(/CS,/RAS,/CAS,/WE) that are buffered in the input buffer 10 to output a signal corresponding to the current command state, e.g., a read signal rd, a read operation timing controlling unit 30 for generating a read command executing signal casp_rd for executing the read operation corresponding to the read signal rd from the command decoder 20 after clock cycles of a clock signal iclk corresponding to an AL(Additive Latency), a memory core block 80 for outputting the corresponding data in response to the read executing signal casp_rd to a data buffer 50, a delay locked loop 70 for outputting a delay locked clock fclk_dll, rclk_dll that is delay locked from the clock signal iclk in order to output data in synchronous to the rising edge and the falling edge of the external clock signal, a data output controlling unit 40 for generating data output enable signals routen, fouten by delaying the read command executing signal casp_rd by the clock cycles corresponding to the CAS latency, and the data output buffer 50 for outputting the data that is transferred from the memory core block 80 through a data output pad(DQ pad) in response to the data output enable signals routen, fouten.

Here, the AL is a concept that is suggested in DDR2 specification, which is the number of cycles of the clock signal iclk between the time when the read command is inputted to the memory device and tRCD(RAS to CAS timing). The tRCD means time between input timing of a row address and input timing of a column address. The memory device is activated at the timing when the row address is inputted. After that, the read command is inputted before the timing when the column address is inputted. The AL is that time between the timing of read command input and the timing of column address input for the actual execution of the read command.

Accordingly, the read operation timing controlling unit 30 delays the received read command rd by the number of cycles of the clock signal iclk corresponding to the AL to generate the read executing signal casp_rd.

On the other hand, the memory core block 80 output the data corresponding to the inputted address to the data output buffer 50 when the read executing signal caps_rd is inputted.

Here, the DLL 70 outputs the delay locked signals fclk_dll, fclk_dll after delaying the clock signal iclk by a predetermined time. The delay locked signals fclk_dll, rclk_dll are clock signals that are generated in the DLL 70 for outputting data to outside of the memory device in synchronous to the rising edge and the falling edge of the external clock, respectively.

The data output controlling unit 40 generates a signal that is internally synchronized to the clock signal iclk by using the read executing signal caps_rd and outputs the data output enable signals routen, fouten to the data output buffer 50, after delaying the clock signal iclk by the number of clock cycles corresponding to the CAS latency. The data output enable signals routen, fouten are synchronized to the delay locked signals fclk_dll, rclk_dll from the DLL 70. Here, the data output enable signals routen, fouten are signals for outputting data in synchronous to the rising edge and the falling edge of the clock signal iclk, respecitively.

In response to the data output enable signals routen, fouten, the data output buffer 50 outputs data that is outputted from the memory core block 80. The transferred data is outputted to outside through the data output pad(DQ pad).

Figure 2:
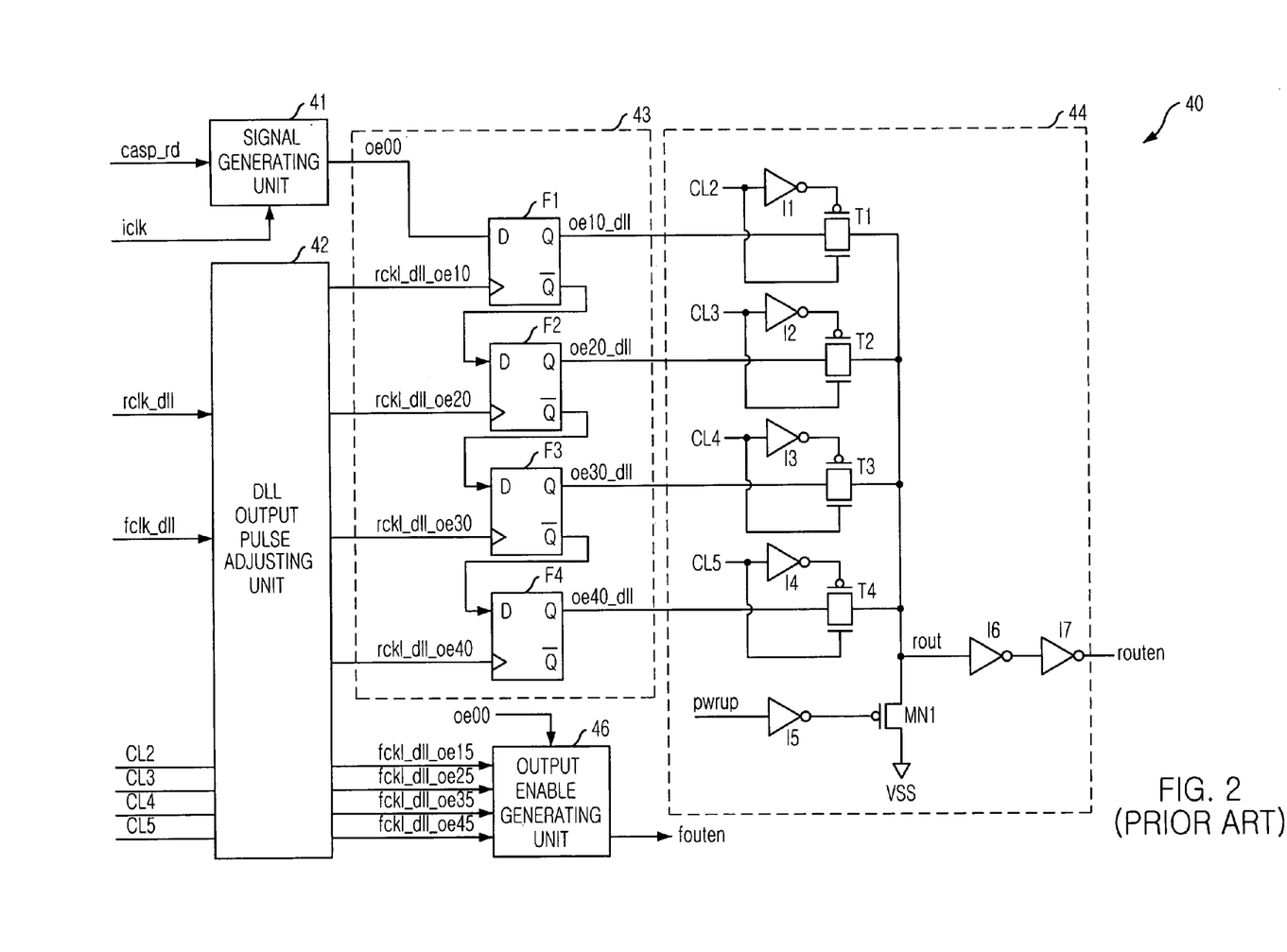
FIG. 2 shows a block diagram of a data output controlling unit in FIG. 1.

FIG. 2 shows a block diagram of the data output controlling unit in FIG. 1.

Referring to FIG. 2, the data output controlling unit 40 includes a signal generating unit 41 for generating an inner signal oe00 by synchronizing the read executing signal caps_rd to an inner clock CK, a DLL output pulse adjusting unit 42 for outputting signals that are delayed versions of the DLL signals rclk_dll, fclk_dll by the number of clock cycles corresponding to the CL(CL=2, 3, 4, 5), respectively, a signal transferring unit 43 for outputting the inner signal oe00 in synchronous to the delay re-locked signals rclk_dll_oe10-rclk_dll_oe40, fclk_dll_oe15-fclk_dll_oe45 that are received from the DLL output pulse adjusting unit 42, and a signal outputting unit 44 for outputting one of a number of signals oe00_dll-oe40_dll that are outputted from the signal transferring unit 43 based on the CL as the data output enable signal routen.

Here, the signal transferring unit 43 and the signal outputting unit 44 are for data output at the rising edge. An output enable generating unit 46 for data output at the falling edge has similar construction and operation and it will be omitted the description for the output enable generating unit 46 for sake of simplicity and the following description is provided only for the output enable signal routen for data output at the rising edge.

The signal transferring unit 43 is formed with a number of D-flipflops receiving the inner signal oe00 and immediately transferring the received inner signal to a next stage. Each of the D-flipflops receives a negative output of a preceding stage as a data input D, and receives corresponding one of the signals rclk_dll_oe10-rclk_dll_oe40, fclk_dll_oe15-fclk_dll_oe45 that are outputted from the DLL output pulse adjusting unit 42 as a clock input, and outputs corresponding one of the signals oe10_dll-oe40_dll depending on the CL from a positive output Q.

The signal outputting unit 44 includes a number of transfer gates T1-T4 that are selectively turned on depending on the CL and outputs corresponding one of the output signals oe01_dll-oe40_dll from the signal transferring unit 43 based on the CL as the data output enable signal routen. Here, the data output enable signal routen enables data output at the rising edge. The signal outputting unit 44 is enabled by a power-up signal pwrup. The power-up signal pwrup is activated if power is inputted stably in a certain level when power is supplied during the initial operation of the memory device.

Figure 3:
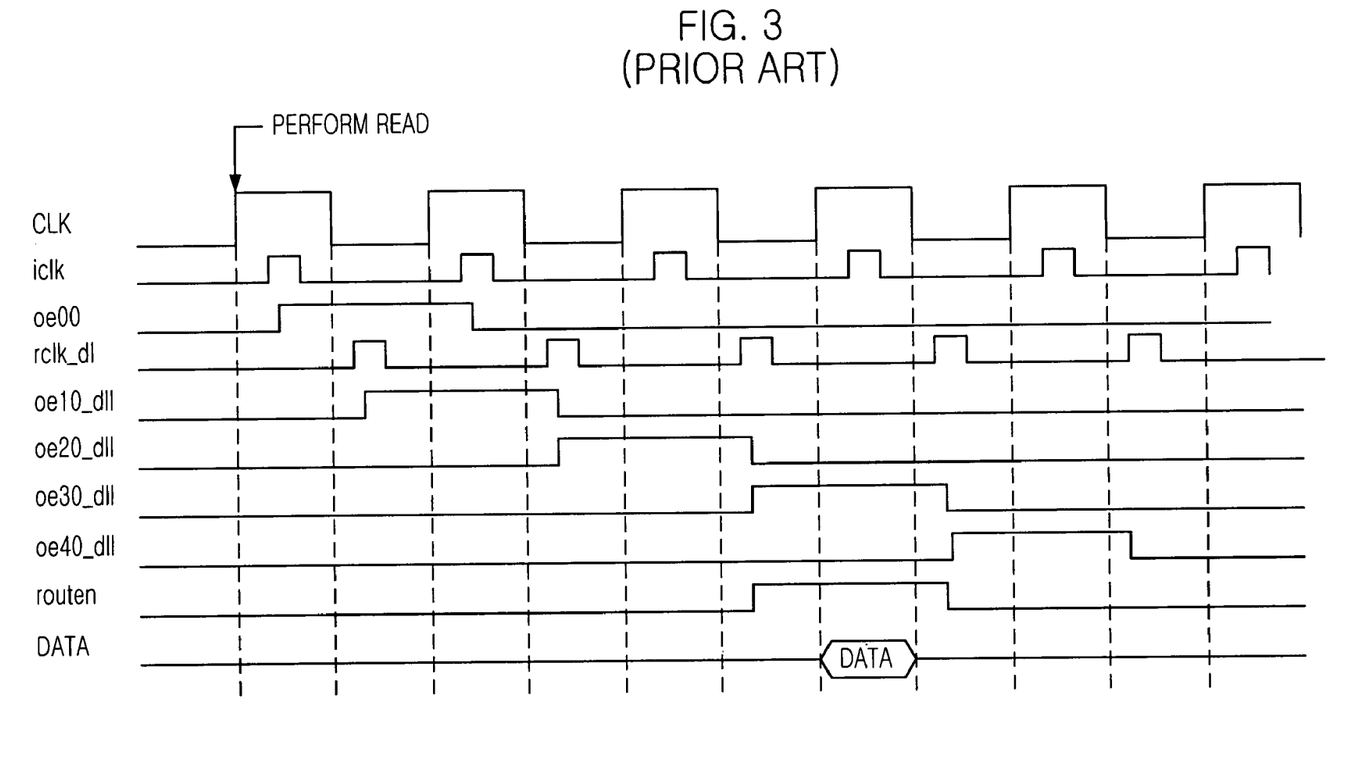
FIG. 3 describes a waveform diagram for operation of the data output controlling unit in FIG. 2.

FIG. 3 describes a waveform diagram for operation of the data output controlling unit in FIG. 2. It will be described for generation and output of the data output enable signal routen in the data output controlling unit 40 referring to FIG. 3.

First, the signal generating unit 41 receives the read executing signal casp_rd to generate the inner signal ie00 that is synchronized to the inner clock iclk.

On the other hand, the DLL output pulse adjusting unit 42 outputs the re-locked signals rclk_dll_oe10-rclk_dll_oe40, for which the delay locked signal rclk_dll from the DLL is delayed by the CL values, to the D-flipflops of the signal transferring unit 43, respectively. Here, the reason why the DLL output pulse adjusting unit 42 adjusts the delay based on the CL values again is to generate the data output enable signals accurately for respective CL.

In turn, each D-flipflop in the signal transferring unit 43 outputs the signals oe10_dll-oe40_dll that are consecutively synchronized to the output signals rclk_dll_oe10-rclk_dll_oe40 of the DLL output pulse adjusting unit 42 to the signal outputting unit 44.

In turn, the signal outputting unit 44 turns on one of the transfer gates depending on the currently applied CL mode to output one of the input signals oe10_dll-oe40_dll to a node rout, which is buffered at buffers I6, I7 to be outputted as the data output enable signal routen. The power-up signal goes to high level when the power supply is stabilized to turn off an NMOS transistor NM1 so as to enable the signal outputting unit 44.

It is shown the case of CL=4 in FIG. 3 where the transfer gate T3 of the signal outputting unit 44 is turned on by a CL4 signal to make an output signal of a flipflop F3 pass through the transfer gate T3 to generate the data output enable signal routen.

While the data output enable signal routen is activated as high level, data is outputted outside.

However, as the operating frequency of the memory device increases, it gets difficult to output data at the timing scheduled by the CAS latency.

The data output timing varies depending on the operating frequency even with a same CAS latency, which makes it even difficult to output data reliably with the conventional structure in a high frequency range, e.g., over 500 Hz).

SUMMARY OF THE INVENTION

It is, therefore, a primary object of the present invention to provide a semiconductor memory device capable of sensing current operating frequency range and controlling data timing depending on it.

In accordance with the present invention, there is provided a semiconductor memory device which comprises a frequency sensing unit for sensing an operating frequency by sensing an amount of lead of a delay locked clock in a delay locked loop compared to an external clock signal, an output enable controlling unit for outputting an output enable signal in response to a CAS latency with controlling the output timing of the output enable signal based on the frequency that is sensed by the frequency sensing unit, and a data output buffer for outputting data that is transferred from a memory core region in response to the output enable signal.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, with reference to the accompanying drawings, a preferred embodiment of the present invention will be explained in detail.

Figure 4:
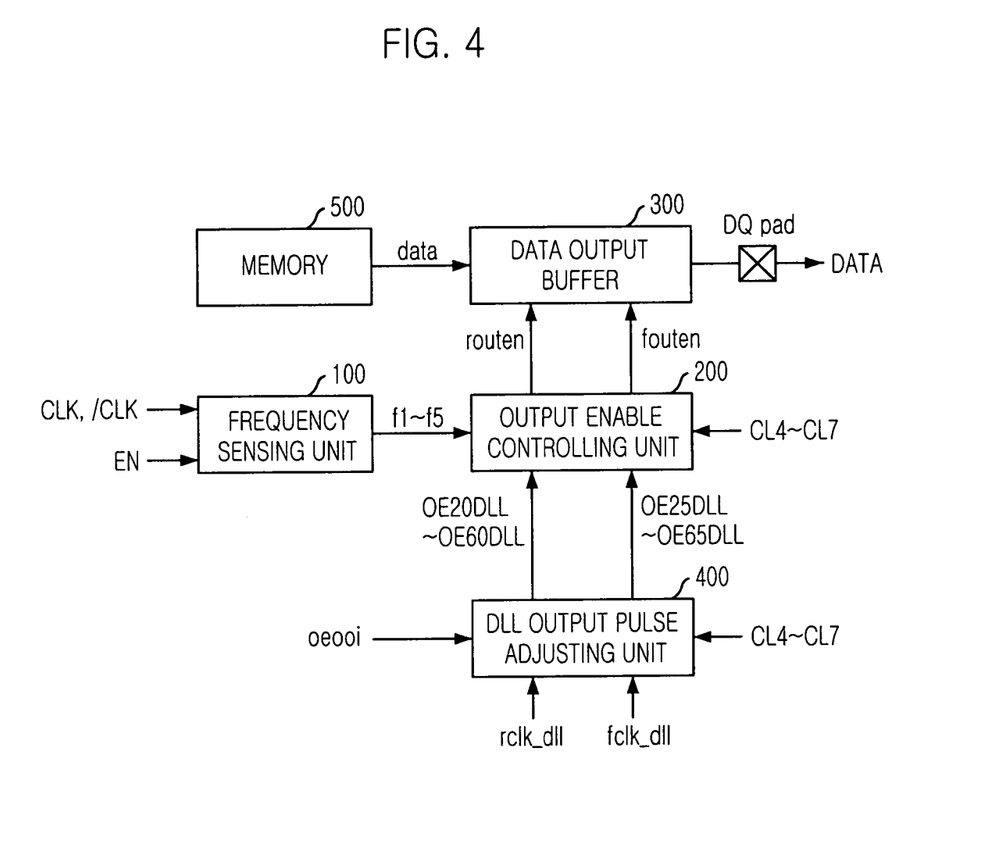
FIG. 4 exemplifies a block diagram of a semiconductor memory device in accordance with the present invention.

FIG. 4 exemplifies a block diagram of a semiconductor memory device in accordance with the present invention.

The semiconductor memory device of the present invention comprises a frequency sensing unit 100 for sensing an operating frequency by sensing an amount of lead of delay locked clocks rclk_dll, fclk_dll of a DLL(delay locked loop) compared to external clock signals CLK, /CLK to output corresponding signals f1–f5, an output enable controlling unit 200 for outputting output enable signals routen, fouten in response to CAS latency value CL4–CL7 with controlling the output timing of the output enable signals routen, fouten based on the frequency that is sensed by the frequency sensing unit 100, and a data output buffer 300 for outputting data that is transferred from a memory core region 500 in response to the output enable signals routen, fouten.

The semiconductor memory device of this embodiment further comprises a DLL output pulse adjusting unit 400 for receiving a start signal oe00i for data output to generate a number of inner delay locked clock signals having certain amount of delays from the delay locked clocks rclk_dll, fclk_dll and for synchronizing the start signal oe00i to the generated inner delay locked clock signals, respectively, to output a number of delay locked clock signals OE20DLL–OE60DLL, OE25DLL–OE65DLL having delays that are spaced by a predetermined interval from each other.

Here, consequently, the output signals from the DLL output pulse adjusting unit 400 are made from the delay locked clocks rclk_dll, fclk_dll by delaying them with the spaced delays and provided to the output enable controlling unit 200.

Figure 5:
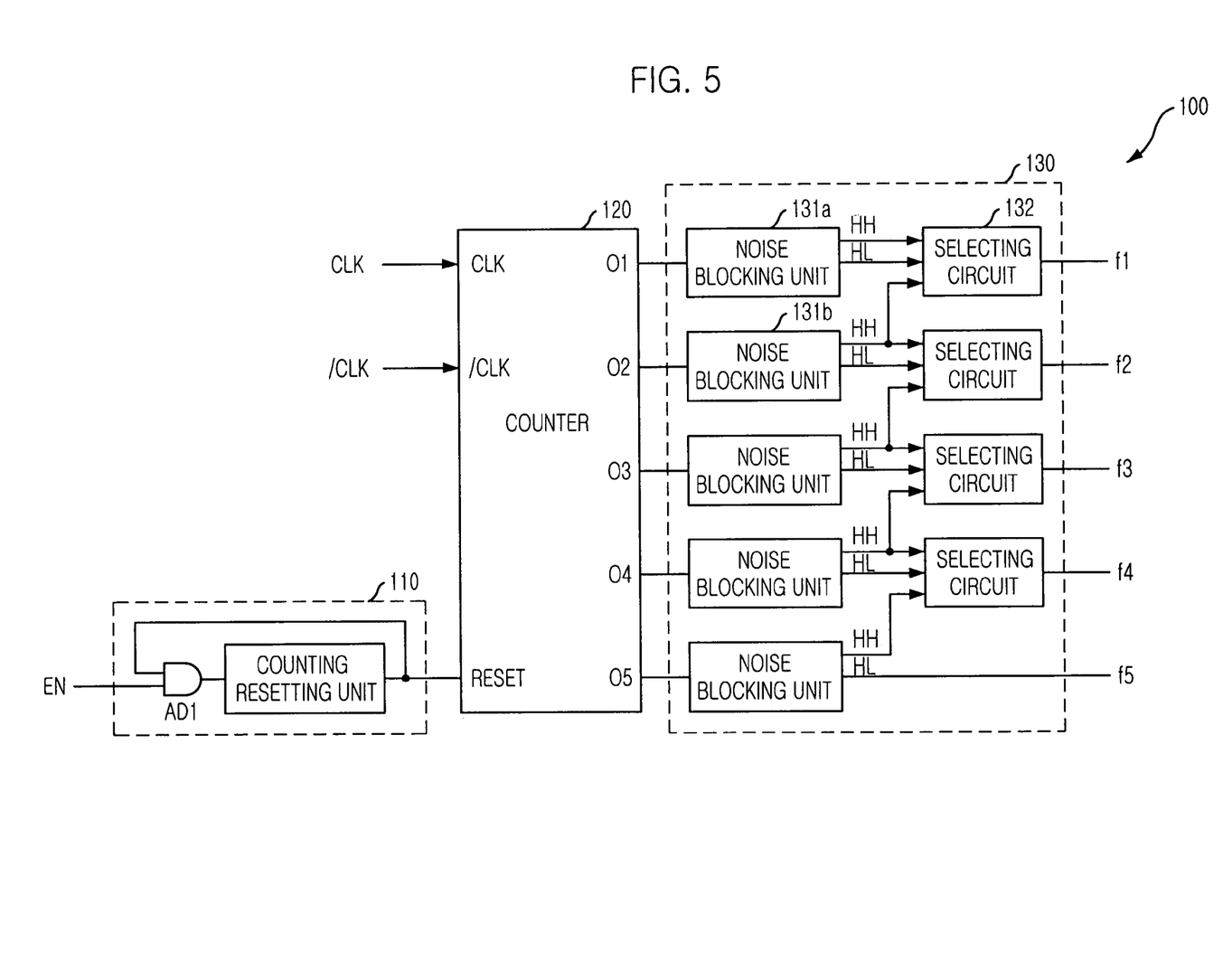
FIG. 5 represents a block diagram of a frequency sensing unit in FIG. 4.

FIG. 5 represents a block diagram of the frequency sensing unit in FIG. 4.

Referring to FIG. 5, the frequency sensing unit 100 includes a counting resetting unit 110 for outputting a reset signal RESET, a counter 120 for counting the number of the external clock signals till the reset signal RESET is inputted, and a noise blocking circuit 130 for blocking noise from the counter signals O1–O5 that are counted in the counter 120.

The noise blocking circuit 130 includes a number of noise blocking units for receiving the counter signals O1–O5 from the counter 120, respectively, and a number of selecting circuits for outputting the frequency signals f1–f5 that contain information about the current operating frequency by using the output signals from the noise blocking unit, respectively.

Figure 6:
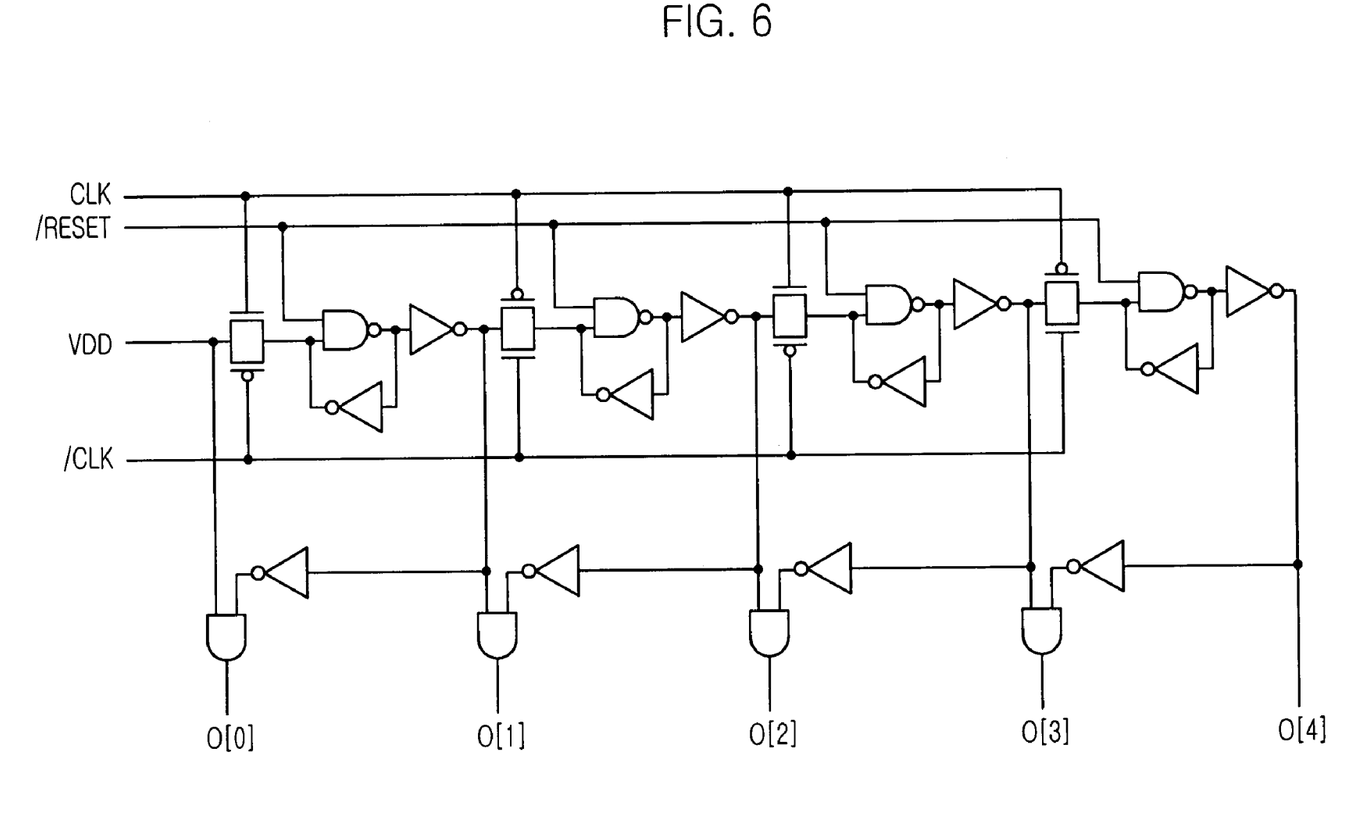
FIG. 6 illustrates a circuit diagram of the counter circuit in FIG. 5.

FIG. 6 illustrates a circuit diagram of the counter in FIG. 5.

Referring to FIG. 6, the counter circuit counts the rising and falling of the clock signal after the reset signal/RESET is inputted till it is inputted once again to output the output signals O1, O2, O3, O4, O5 corresponding to the counted number.

Figure 7:
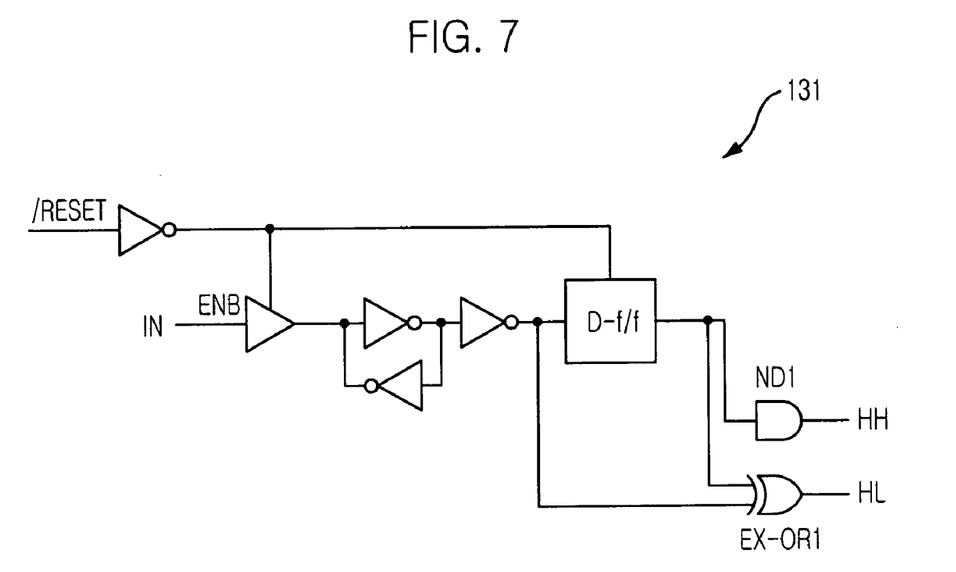
FIG. 7 shows a noise blocking unit in FIG. 5.

FIG. 7 shows the noise blocking unit in FIG. 5.

Referring to FIG. 7, the noise blocking unit includes an input unit 131_1 for inverting one of the input signals from the counter in response to the reset signal /RESET, a D-flipflop 131_2 for synchronizing the output signal of the input unit 131_1 to the inverted reset signal /RESET, a NAND gate ND1 receiving the output of the input unit 131_1 and the flipflop 131_2 to output a first output signal HH, and an exclusive OR gate EX–OR1 receiving the output of the input unit 131_1 and the output of the flipflop 131_2 to output a second output signal HL.

Figure 8:
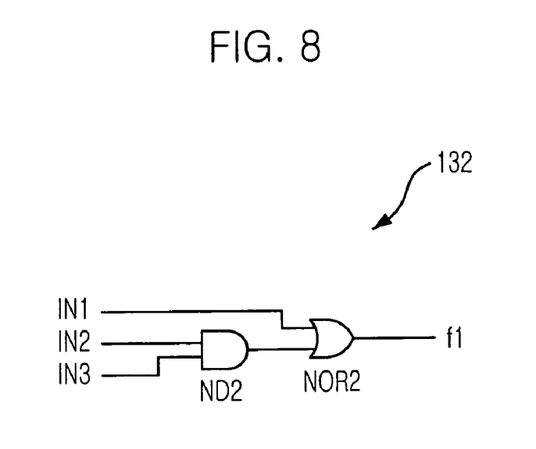
FIG. 8 provides a selecting circuit in FIG. 5.

FIG. 8 provides the selecting circuit in FIG. 5.

Referring to FIG. 8, the selecting unit includes a NAND gate ND2 receiving a second input IN2 and a third input IN3, and an NOR gate NOR2 receiving the output of the NAND gate ND2 and a first input IN1 to output the frequency signal f1. Accordingly, each of the four selecting circuits of the noise blocking circuit 130 receives the first input and the second input from the corresponding noise blocking unit and the third input from the output of the next stage noise blocking unit.

Figure 9A:
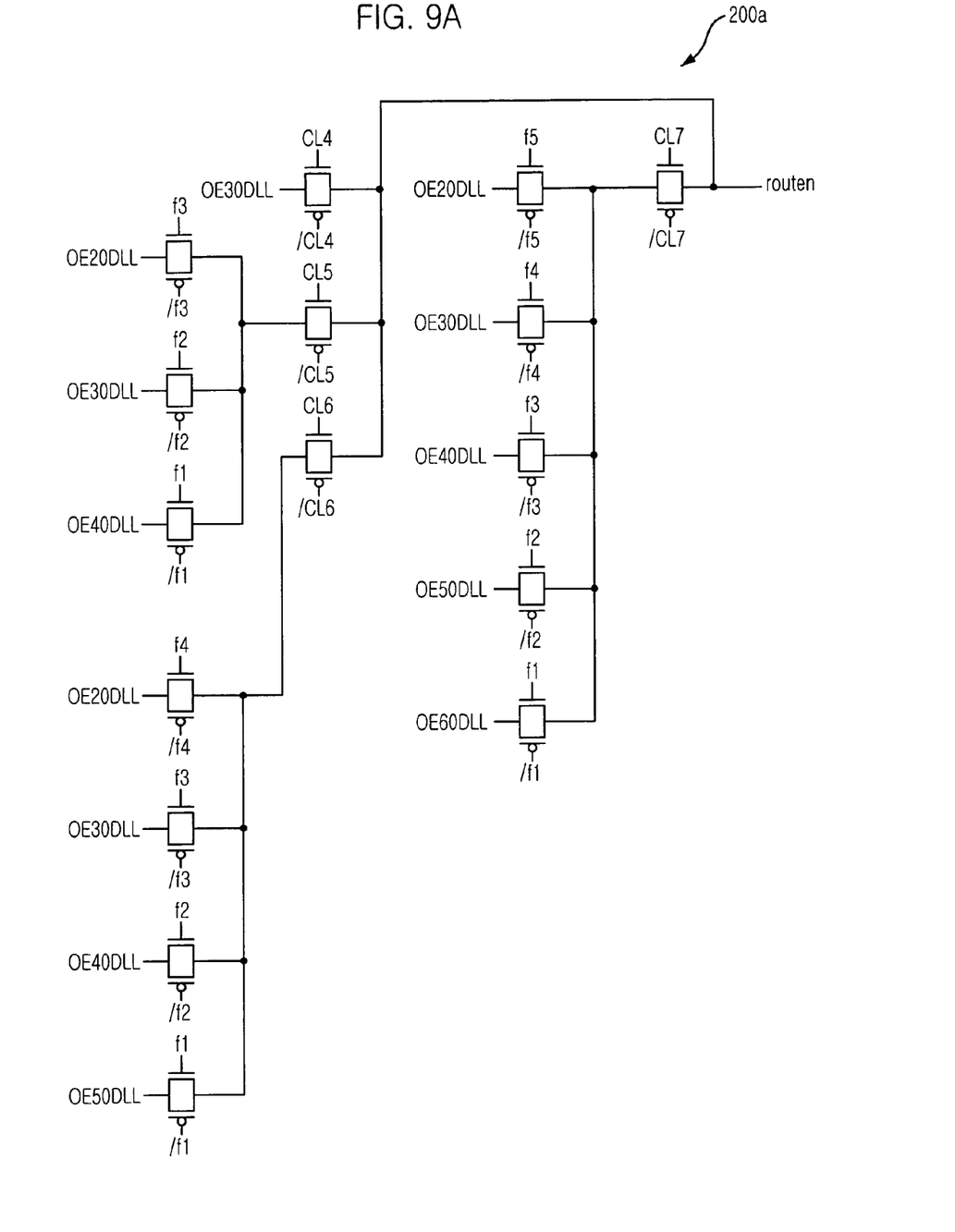
FIGS. 9a and 9b are circuit diagrams of an output enable controlling unit in FIG. 4.
Figure 9B:
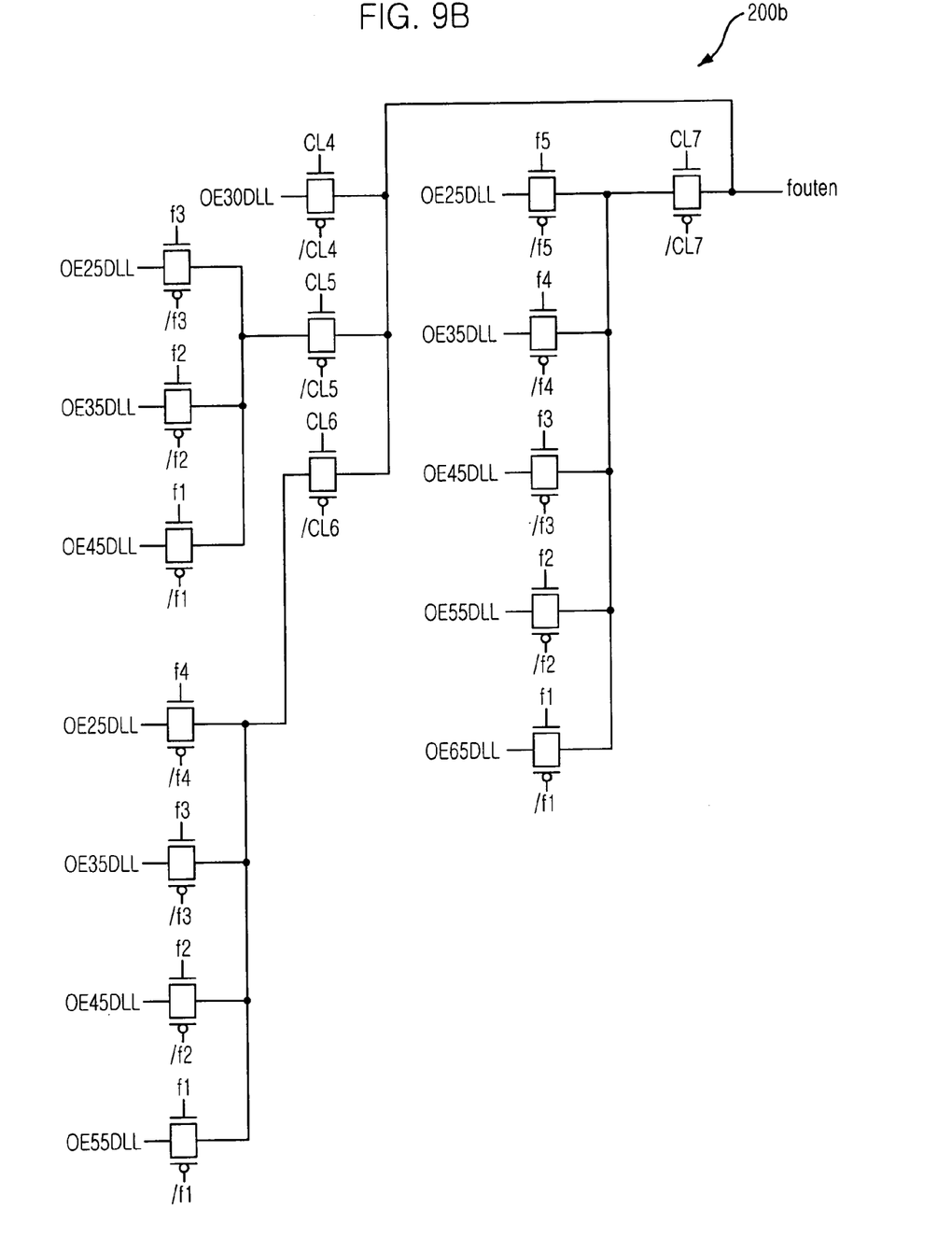

FIGS. 9a and 9b are circuit diagrams of the output enable controlling units in FIG. 4 for outputting the rising data output enable signal routen and the falling data output enable signal fouten, respectively.

The first output enable controlling unit 200a in FIG. 9a includes a number of transfer circuits 210a, 220a, 230a for selectively transferring a number of delay locked clock signals OE20DLL–OE60DLL that are outputted from the DLL output pulse adjusting unit 400 with grouping depending on the operating frequency, and a CAS latency selecting circuit 240a for outputting the output signals of a number of the transfer circuits in response to the CAS latency.

The first transfer circuit 210a selectively transfers the delay locked clocks signals OE20DLL, OE30DLL, OE40DLL depending on the frequency signals f1, f2, f3.

The second transfer circuit 220a selectively transfers the delay locked clocks signals OE20DLL, OE30DLL, OE40DLL, OE50DLL depending on the frequency signals f1, f2, f3, f4.

The third transfer circuit 230a selectively transfers the delay locked clocks signals OE20DLL, OE30DLL, OE40DLL, OE50DLL, OE60DLL depending on the frequency signals f1, f2, f3, f4, f5.

As a result, if the frequency f1 is active, the delay locked clock signal OE40DLL is transferred from the first transfer circuit 210a, the delay locked clock signal OE50DLL is transferred from the second transfer circuit 220a, and the delay locked clock signal OE60DLL is transferred from the third transfer circuit 230a.

If the frequency f3 is active, the delay locked clock signal OE20DLL is transferred from the first transfer circuit 210a, the delay locked clock signal OE30DLL is transferred from the second transfer circuit 220a, and the delay locked clock signal OE40DLL is transferred from the third transfer circuit 230a.

Once the clock signals that are selectively delay-locked at the first to the third transfer circuits 210a–230a are transferred to the CAS latency selecting circuit 240a, one of the transferred delay locked clock signals is outputted as the rising data output enable signal depending on the CAS latency that is currently set in the memory device.

The second output enable controlling unit 200b in FIG. 9b is formed as similarly as the first output enable controlling unit 200a.

Figure 10:
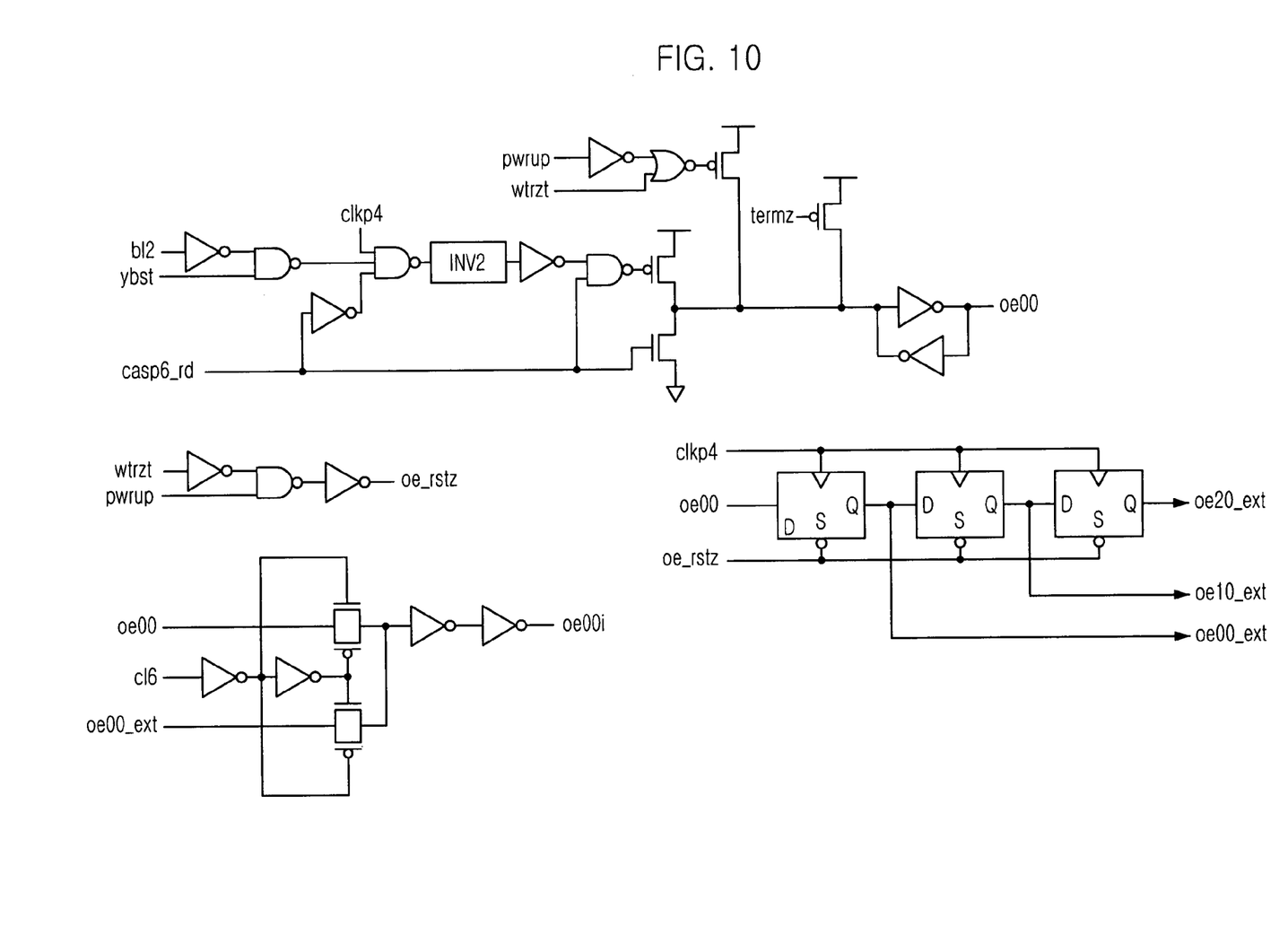
FIG. 10 represents a circuit diagram for generating an initialization signal to be inputted to a DLL output pulse adjusting unit in FIG. 4.

FIG. 10 represents a circuit diagram for generating an initialization signal oe00i to be inputted to the DLL output pulse adjusting unit in FIG. 4, which is included in a synchronous memory device. The initialization signal oe00i is internally generated for generating the data output enable signals routen, fouten that determine the timing when the memory device outputs data. A number of delay signals are generated referring to the initialization signal oe00i, one of which is used to output as the data output enable signals routen, fouten.

Figure 11:
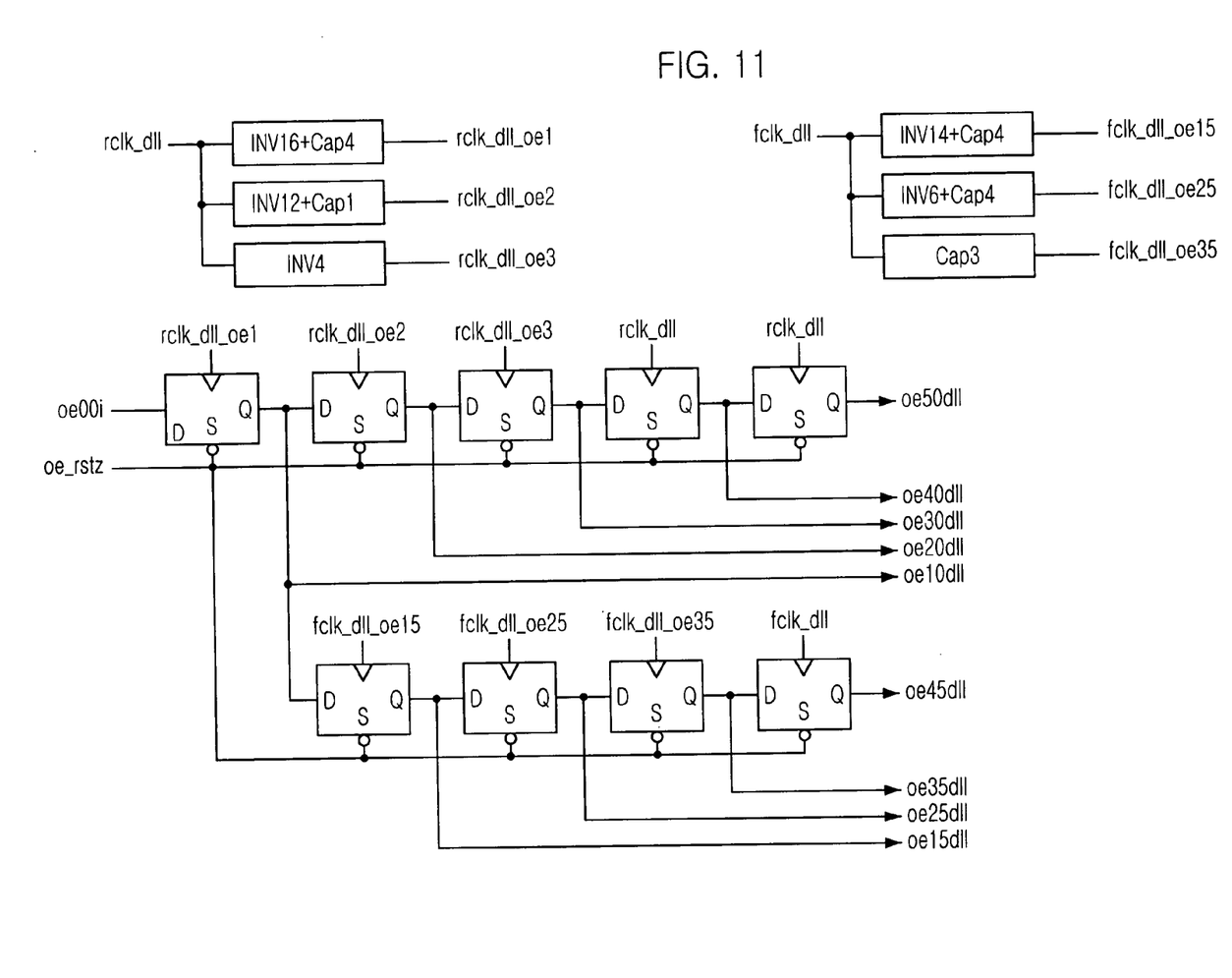
FIG. 11 offers a circuit diagram of a DLL output pulse adjusting unit in FIG. 4.

FIG. 11 offers a circuit diagram of the DLL output pulse adjusting unit in FIG. 4.

Referring to FIG. 11, the DLL output pulse adjusting unit 400 generates a number of delayed inner signals rclk_dll_oe1-rclk_dll_oe3, fclk_dll_oe15-fclk_dll_oe35 by using the delay locked signals rclk_dll, fclk_dll from the DLL.

In turn, a number of the delay locked clock signals OE10DLL, OE20DLL, OE30DLL, OE40DLL, OE50DLL, OE15DLL, OE25DLL, OE35DLL, OE45DLL are generated by synchronizing the initialization signal oe00i to a number of the inner signals rclk_dll_oe1-rclk_dlloe3, fclk_dll_oe15-fclk_dll_oe35. At this point, selected one of the delay locked clock signals OE10DLL, OE20DLL, OE30DLL, OE40DLL, OE50DLL, OE15DLL, OE25DLL, OE35DLL, OE45DLL is selected as the data output enable signal in response to the CAS latency.

Figure 12:
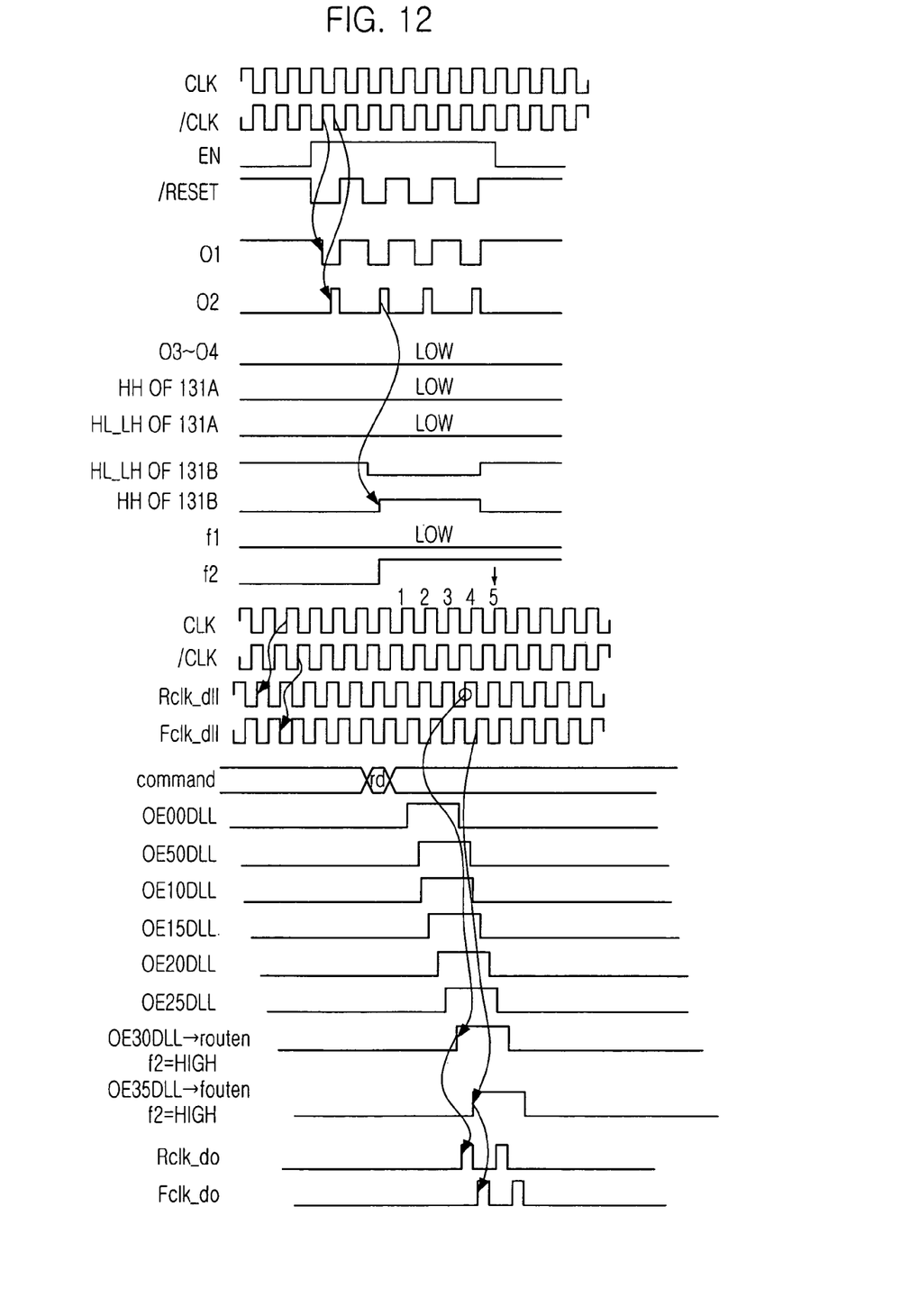
FIG. 12 is a waveform diagram for operation of a semiconductor memory device in FIG. 5.

FIG. 12 is a waveform diagram for operation of the semiconductor memory device in FIG. 5.

It will be described for the process of generating the data output enable signal in the semiconductor memory device in accordance with the present invention with reference to FIG. 4 to FIG. 12.

First, the frequency sensing unit 100 checks and counts the amount of lead of the delay locked clocks rclk_DLL, fclk_DLL from the DLL compared to the external clock signals CLK, /CLK.

The counter 120 counts the numbers of rising/falling of the external clock signals CLK, /CLK till the reset signal is inputted to output the output signals O1–O5 depending on the counted values.

The output signals O1–O5 from the counter 120 represent the amount of lead of the delay locked clocks rclk_dll, fclk_dll compared to the external clock signals CLK, /CLK.

The lead amount is checked every four clocks and the checking result signal is inputted to the noise blocking unit. The noise blocking unit prohibits noise from impacting on the output signal of the counter 120.

The count value of the counter can flicker due to external noise. For example, the count value can go back and forth between 1 and 2(noise may be in 0.5 tCK range). To make the counter robust to noise, the noise blocking unit is included to select the first frequency signal f1 when the count value is 0 or 1, the second frequency signal f2 when the count value is 1 or 2 and the third frequency signal f3 when the count value is 2 or 3.

Each of the five noise blocking units determines if two checking result signals that are sampled with four-clock interval are equal or not to activate the first output signal HH when those are identical and the second output signal HL otherwise, which suppress variation that occurs due to external noise.

The frequency signals f1–f5 are outputted to the output enable controlling unit 200 for adjusting the output timing of the data output enable signal.

In the operation of the output enable controlling unit 200, the first output enable controlling unit 200a selectively outputs a number of delay locked clock signals OE10DLL, OE20DLL, OE30DLL, OE40DLL, OE50DLL to the CAS latency selecting unit 200a. The CAS latency selecting unit 200a selects one of the delay locked clock signals based on the CAS latency CL to output as the data output enable signal routen.

Here, comparing to the conventional scheme in which all of the internally delay locked clocks OE10DLL, OE20DLL, OE30DLL, OE40DLL, OE50DLL are transferred regardless of the operating frequency, only some of delay locked clocks OE10DLL, OE20DLL, OE30DLL, OE40DLL, OE50DLL are transferred for selection based on the CAS latency in the present invention.

Accordingly, for the high frequency operation, all of the delay locked clocks OE10DLL, OE20DLL, OE30DLL, OE40DLL, OE50DLL are not transferred but properly selected ones are transferred. Therefore, even for the high frequency operation, the data output enable signal can be outputted at the exact timing stably.

As shown in FIG. 12, the frequency sensing unit 100 activates the frequency signal f2 when the delay locked clock leads the clock signal by two clocks, and the clock signals OE30DLL, OE35DLL that are delay locked based on CAS latency of 5 after the read command is executed are outputted as the data output enable signals routen, fouten. The memory device finally outputs data in response to rising data output timing signals Rclk,_do, Fclk_do that are generated based on the data output enable signals routen, fouten.

The memory device of the present invention is capable of controlling the data output timing depending on the operating frequency so as to output data with optimized for the operating frequency. Further, in the high frequency operation, the memory device can output data reliably so as to facilitate development of high frequency memory device.

The present application contains subject matter related to Korean patent applications No. 2004-32805, filed in the Korean Patent Office on May 10, 2004, the entire contents of which being incorporated herein by reference.

While the present invention has been described with respect to the particular embodiments, it will be apparent to those skilled in the art that various changes and modification may be made without departing from the spirit and scope of the invention as defined in the following claims.

What is claimed is:

1. A semiconductor memory device for stably outputting data, comprising:
   frequency sensing means for sensing an operating frequency by sensing an amount of lead of a delay locked clock in a delay locked loop compared to an external clock signal;

output enable controlling means for outputting an output enable signal in response to a CAS latency with controlling the output timing of the output enable signal based on the frequency that is sensed by the frequency sensing means; and a data output buffer for outputting data that is transferred from a memory core region in response to the output enable signal, wherein the frequency sensing means includes:

a counter for counting a clock signal;

counting reset controlling means for resetting the counter with a predetermined period in response to an enable signal; and noise detecting means for detecting noise in the counted value.

2. The semiconductor memory device of claim 1, wherein the counting reset controlling means is enabled in response to the enable signal so as to reset the counter in response to a period that is delayed by a delay model of a delay locked loop.

3. A semiconductor memory device for stably outputting data, comprising:

a frequency sensing means for counting a cycle number of an external clock signal to thereby generate frequency signals containing an operating frequency information of the semiconductor memory device;

a DLL output pulse adjusting means for receiving a DLL signal to generate plural DLL adjusted signals in response to a CAS latency, wherein the plural DLL adjusted signals have a different phase by a predetermined interval;

an output enable controlling means for outputting an output enable signal in response to the CAS latency and the plural DLL adjusted signals, wherein an output timing of the output enable signal is determined based on the frequency; and a data output buffer for outputting data in response to the output enable signal.

4. The semiconductor memory device as recited in claim 3, wherein the frequency sensing means includes:

a counter for counting the external clock signal;

a counter reset controlling means for resetting the counter with a predetermined period in response to an enable signal; and a noise detecting means for detecting noise in the counted value to generate the frequency signals.

5. The semiconductor memory device as recited in claim 4, wherein the counting reset controlling means is enabled in response to the enable signal so as to reset the counter in response to a period that is delayed by a delay model of a delay locked loop.

6. The semiconductor memory device as recited in claim 3, wherein the DLL output pulse adjusting means receives an initialization signal as a reference signal for generating the plural DLL adjusted signals.

7. The semiconductor memory device as recited in claim 6, wherein the DLL signal is constituted with a first and a second DLL signals and the plural DLL adjusted signals is constituted with first DLL adjusted signals, based on the first DLL signal, and second DLL adjusted signals, based on the second DLL signal.

8. The semiconductor memory device as recited in claim 7, wherein the predetermined interval between each of the first DLL adjusted signals is equal to the predetermined interval between each of second DLL adjusted signals.

9. The semiconductor memory device as recited in claim 8, wherein the predetermined interval between each of the first DLL adjusted signals is a delay amount of D-flip-flop.

10. A method for stably outputting data stored in a semiconductor memory device, comprising the steps of:

counting a cycle number of an external clock signal to thereby generate frequency signals containing an operating frequency information of the semiconductor memory device;

receiving a DLL signal to generate plural DLL adjusted signals in response to a CAS latency, wherein the plural DLL adjusted signals have a different phase by a predetermined interval;

outputting an output enable signal in response to the CAS latency and the plural DLL adjusted signals, wherein an output timing of the output enable signal is determined based on the frequency; and outputting data in response to the output enable signal.

11. The method as recited in claim 10, wherein the step of counting a cycle number of an external clock signal to thereby generate frequency signals includes the steps of:

counting the external clock signal;

resetting the counter with a predetermined period in response to an enable signal; and detecting noise in the counted value to generate the frequency signals.

* * * * *